(12) United States Patent
Owa

(10) Patent No.: US 7,872,355 B2
(45) Date of Patent: Jan. 18, 2011

(54) SEMICONDUCTOR INTEGRATED CIRCUIT AND METHOD OF DESIGNING SEMICONDUCTOR INTEGRATED CIRCUIT

(75) Inventor: Kouji Owa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 508 days.

(21) Appl. No.: 11/785,253

(22) Filed: Apr. 16, 2007

(65) Prior Publication Data

US 2007/0246827 A1 Oct. 25, 2007

(30) Foreign Application Priority Data

Apr. 17, 2006 (JP) ............... 2006-113314

(51) Int. Cl.
H01L 23/48 (2006.01)
(52) U.S. Cl. .................. 257/776; 257/773; 257/734; 257/E23.168
(58) Field of Classification Search ................. 257/499
See application file for complete search history.

(56) References Cited

U.S. PATENT DOCUMENTS

| | | | | |
|---|---|---|---|---|
| 5,128,737 A * | 7/1992 | van der Have | ............... | 257/503 |
| 5,341,049 A * | 8/1994 | Shimizu et al. | ............. | 326/101 |
| 6,483,165 B2 * | 11/2002 | Ooishi et al. | ................. | 257/499 |
| 6,696,762 B2 * | 2/2004 | Keeth | ......................... | 257/776 |
| 6,732,335 B2 * | 5/2004 | Takabayashi et al. | .......... | 716/1 |
| 6,763,511 B2 * | 7/2004 | Banno et al. | ................... | 716/12 |
| 6,925,627 B1 * | 8/2005 | Longway et al. | ............... | 716/13 |
| 6,937,047 B2 * | 8/2005 | Tran et al. | .................... | 324/763 |
| 7,023,058 B2 * | 4/2006 | Kanno et al. | ................. | 257/371 |
| 7,030,651 B2 * | 4/2006 | Madurawe | ................... | 326/41 |
| 7,214,605 B2 * | 5/2007 | Ramanathan et al. | ....... | 438/614 |
| 7,217,963 B2 * | 5/2007 | Kanno et al. | ................. | 257/207 |
| 7,394,156 B2 * | 7/2008 | Tokunaga et al. | ........... | 257/758 |
| 7,411,267 B2 * | 8/2008 | Yamawaki et al. | .......... | 257/499 |
| 7,425,720 B2 * | 9/2008 | Kaeriyama et al. | ............. | 257/4 |
| 2002/0005584 A1 * | 1/2002 | Domae | ........................ | 257/758 |
| 2002/0013931 A1 * | 1/2002 | Cano et al. | ..................... | 716/1 |
| 2002/0043668 A1 * | 4/2002 | Tokunaga et al. | ........... | 257/203 |
| 2003/0200509 A1 * | 10/2003 | Takabayashi et al. | .......... | 716/1 |
| 2004/0155302 A1 * | 8/2004 | Zhang | ......................... | 257/390 |
| 2005/0030055 A1 * | 2/2005 | Tran et al. | .................... | 324/763 |
| 2005/0127406 A1 * | 6/2005 | Tokunaga et al. | ........... | 257/204 |
| 2005/0160391 A1 * | 7/2005 | Orita | ........................... | 716/13 |

(Continued)

FOREIGN PATENT DOCUMENTS

JP 2004-273844 9/2004

*Primary Examiner*—Leonardo Andújar
*Assistant Examiner*—William Harriston
(74) *Attorney, Agent, or Firm*—McGinn IP Law Group, PLLC (57) ABSTRACT

A semiconductor integrated circuit has: a power pad placed on a chip; and a circuit group connected to the power pad through a power wiring structure. The power wiring structure includes: a plurality of first power wirings and a plurality of second power wirings that are formed in different wiring layers and overlap with each other at a plurality of intersections; and vias connecting the plurality of first power wirings and the plurality of second power wirings. The circuit group includes a first functional block placed on a first region. The vias are not placed at a part of the plurality of intersections within a second region located between the first region and the power pad.

3 Claims, 8 Drawing Sheets

U.S. PATENT DOCUMENTS

2005/0248036 A1* 11/2005 Kelly et al. .................. 257/777
2006/0012050 A1* 1/2006 Maeno et al. ................ 257/774
2006/0102934 A1* 5/2006 Kanno et al. ................ 257/204
2007/0222082 A1* 9/2007 Sonohara et al. ............ 257/773
2007/0285254 A1* 12/2007 Usami ..................... 340/572.7

* cited by examiner

R1 (IR-drop > ACCEPTABLE AMOUNT)
R2 (IR-drop < ACCEPTABLE AMOUNT)

SEMICONDUCTOR INTEGRATED CIRCUIT AND METHOD OF DESIGNING SEMICONDUCTOR INTEGRATED CIRCUIT

BACKGROUND OF THE INVENTION

1. Field of the Invention

The present invention relates to a semiconductor integrated circuit and a method of designing thereof. In particular, the present invention relates to a power wiring structure of a semiconductor integrated circuit and a method of designing thereof.

2. Description of the Related Art

Figure 1:
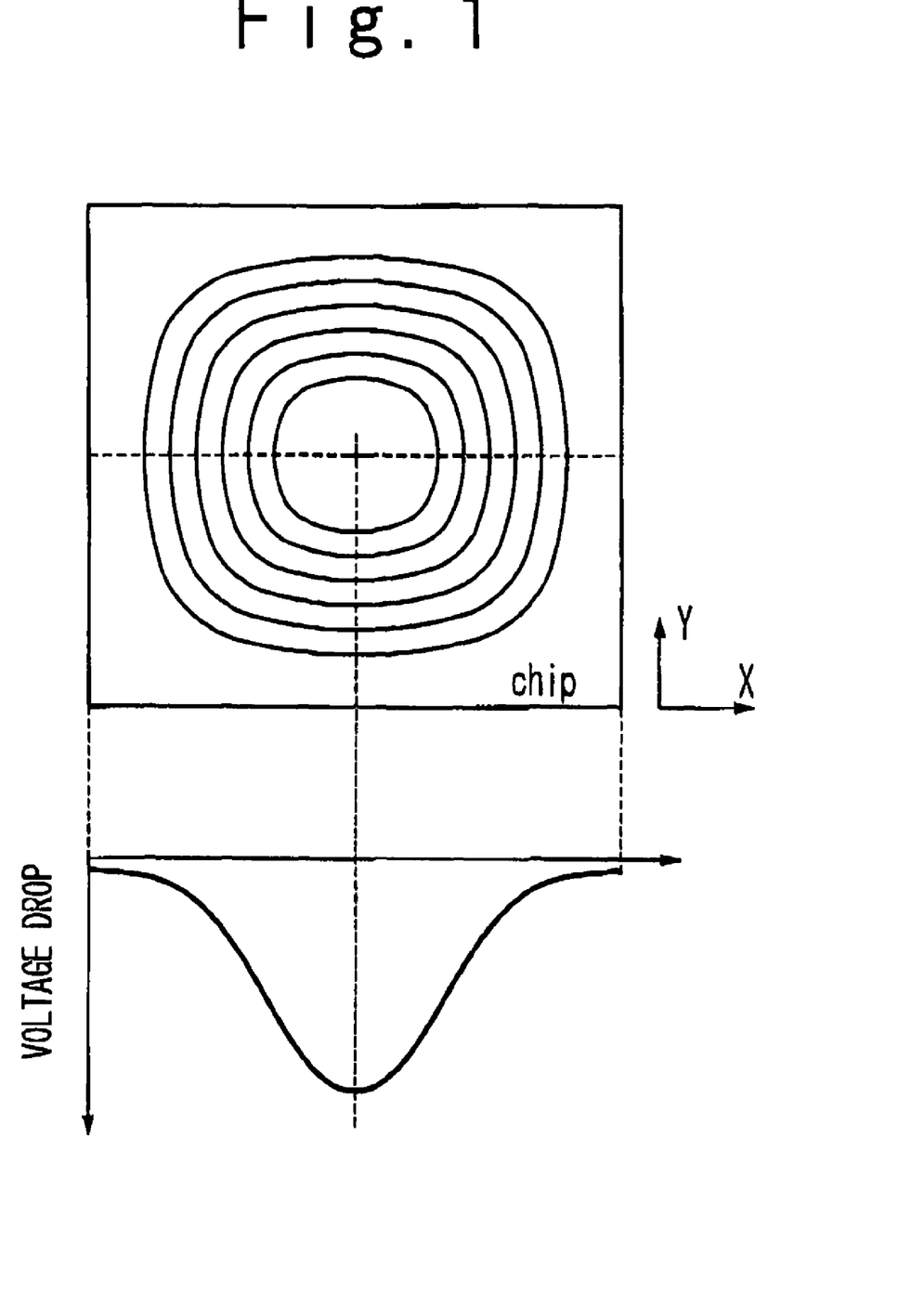
FIG. 1 is a diagram showing a distribution of voltage drop in a semiconductor chip.

In general, a power wiring network of a semiconductor integrated circuit has a mesh wiring structure. Electric power supplied to a power pad is distributed to the mesh power wiring network through an I/O cell placed at a periphery of a semiconductor chip. A cell in the semiconductor integrated circuit receives a current from the power wiring network and consumes the current. Since the current is consumed at respective points in the semiconductor integrated circuit, a voltage drop (an IR drop) in the power wiring network increases towards the central part of the semiconductor chip, as shown in FIG. 1. In other words, the potential is high at the periphery of the semiconductor chip and decreases towards the central part of the semiconductor chip.

If the amount of the voltage drop exceeds an acceptable amount at a point, a cell placed at that point can not give its true performance sufficiently. In particular, since the potential becomes low around the central part of the chip, there is a possibility that malfunction such as decrease in an operation speed occurs at the cell placed in the vicinity of the central part. It is therefore desirable to provide a technique that can prevent the above-described malfunction caused by the voltage drop. Particularly in recent years, power supply potential is decreased and thus the influence of the voltage drop becomes conspicuous, with increasing miniaturization of the semiconductor integrated circuit. Measures for the voltage drop are one of the most important issues.

Japanese Laid-Open Patent Application JP-P2004-273844 describes a semiconductor integrated circuit. The semiconductor integrated circuit includes a first mesh power wiring for supplying predetermined power to a first region, and a second mesh power wiring for supplying the same power as the predetermined power to a second region which is different from the first region. The first mesh power wiring and the second mesh power wiring are separated from each other at a boundary between the first region and the second region. The first region is located at a periphery of a chip, and the power is directly supplied from a chip ring to the first mesh power wiring. On the other hand, the second region is located at a central part of the chip, and the power is supplied from the chip ring to the second mesh power wiring through a power supply wiring.

SUMMARY OF THE INVENTION

As described above, the amount of the voltage drop may exceed the acceptable amount depending on a region in the semiconductor integrated circuit. This causes the malfunction of the cell such as the decrease in the operation speed. According to the technique described in the above-mentioned patent document, a special wiring is necessary for supplying the power to the second mesh power wiring. Since it is necessary to prepare a wiring region for the special wiring, routing performance is deteriorated and the technique lacks versatility.

In a first aspect of the present invention, a method of designing a semiconductor integrated circuit is provided. The method includes: (A) placing a functional block; (B) determining a location of a power pad; and (C) placing a power wiring structure connecting the power pad and the functional block. The (C) step includes: (a) placing a plurality of first power wirings in a first wiring layer; (b) placing a plurality of second power wirings in a second wiring layer that is an upper layer of the first wiring layer, the plurality of second power wirings overlapping the plurality of first power wirings at a plurality of intersections; (c) placing vias connecting the plurality of first power wirings and the plurality of second power wirings at all of the plurality of intersections; (d) analyzing a voltage drop with regard to the functional block; and (e) if the amount of the voltage drop exceeds an acceptable amount, removing a part of the vias on a current path to the functional block.

According to the present invention as described above, if the amount of the voltage drop exceeds the acceptable amount at a certain point, a part of the vias on the current path to the certain point is removed. As a result, the amount of the voltage drop at the certain point is suppressed. By removing the via from a region having sufficient voltage drop margin, it is possible to make the voltage drop at the point within the allowable level. Therefore, the malfunction of the cell can be prevented. Moreover, according to the present invention, it is not necessary to provide a special wiring but to just remove a part of the vias, in order to reduce the voltage drop. Therefore, the deterioration of the routing performance is prevented and the versatility is improved.

In a second aspect of the present invention, a semiconductor integrated circuit is provided. The semiconductor integrated circuit has: a power pad placed on a chip; and a circuit group connected to the power pad through a power wiring structure. The power wiring structure includes: a plurality of first power wirings and a plurality of second power wirings that are formed in different wiring layers and overlap with each other at a plurality of intersections; and vias connecting the plurality of first power wirings and the plurality of second power wirings. The circuit group includes a first functional block placed on a first region. The vias are not placed at a part of the plurality of intersections within a second region located between the first region and the power pad.

According to the present invention, it is possible to prevent the malfunction of the cell caused by the voltage drop. Moreover, the deterioration of the routing performance can be prevented. Furthermore, the present invention can be universally applied to any chips

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Design Object

Figure 2:
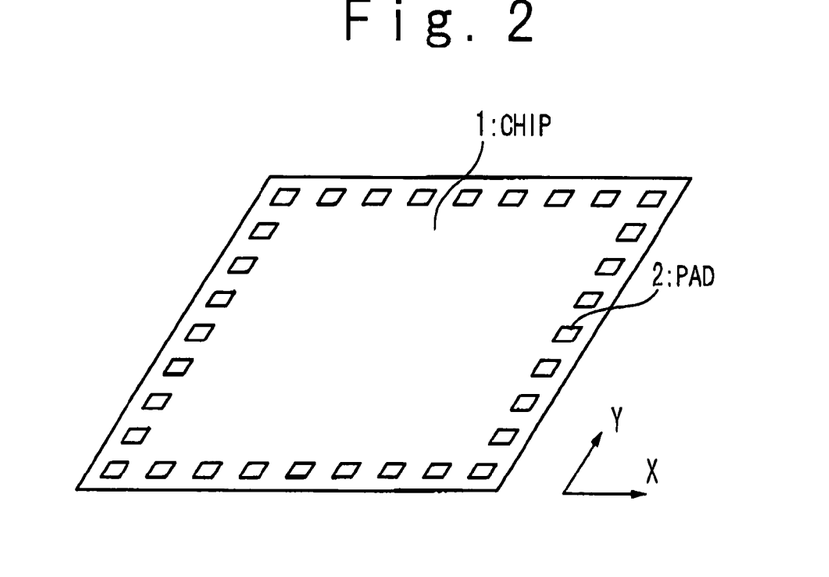
FIG. 2 is a schematic diagram showing a semiconductor chip according to an embodiment of the present invention.

First explained will be a schematic structure of a semiconductor integrated circuit that is a design object (target) in the present embodiment. FIG. 2 shows an appearance of a semiconductor chip 1 according to the present embodiment. As shown in FIG. 2, a plurality of pads 2 are placed on a periphery part (outer circumferential part) of the semiconductor chip 1. The plurality of pads 2 include an input/output pad, a power pad, and a ground pad. The placement pattern of the plurality of pads 2 is not limited to that illustrated in FIG. 2.

Figure 3:
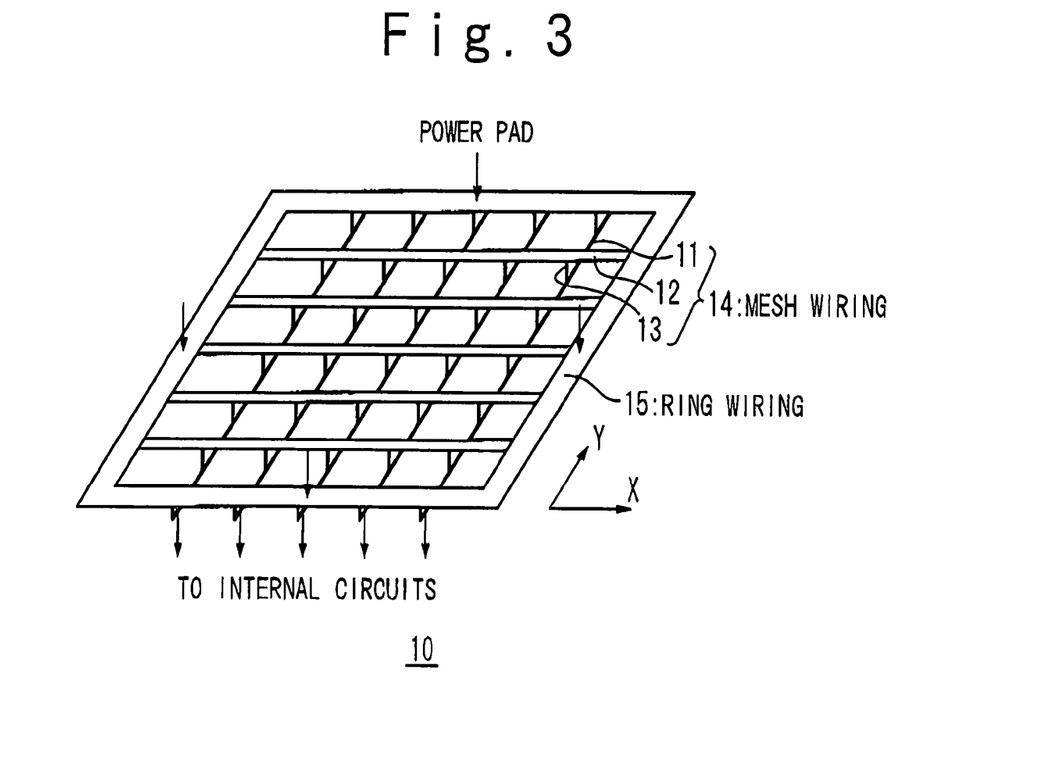
FIG. 3 is a schematic diagram showing a power wiring structure according to the embodiment of the present invention.

In the semiconductor chip 1, a power wiring structure 10 as shown in FIG. 3 is formed. The power wiring structure 10 connects the power pad and an internal circuit group and consists of the following wirings. In a first wiring layer, a plurality of first power wirings 11 are formed substantially parallel to each other along a Y-direction. In a second wiring layer that is an upper layer of the first wiring layer, a plurality of second power wirings 12 are formed substantially parallel to each other along a X-direction. The X-direction and the Y-direction are orthogonal to each other. Therefore, the plurality of first power wirings 11 and the plurality of second power wirings 12 overlap with each other at a plurality of intersections. In other words, the plurality of first power wirings 11 and the plurality of second power wirings 12 are provided in a "mesh form". Moreover, vias 13 are so placed at some of the plurality of intersections as to connect the plurality of first power wirings 11 and the plurality of power wirings 12. The above-mentioned first power wirings 11, the second power wirings 12 and the vias 13 constitute a mesh wiring 14.

Furthermore, a ring wiring 15 having a ring shape is provided at the periphery of the semiconductor chip 1. The ring wiring 15 is a backbone power wiring for supplying electric power to the mesh wiring 14 and so provided as to surround the mesh wiring 14. A power pad (2a) among the above-mentioned plurality of pads 2 is connected to the ring wiring 15 through an I/O cell including a buffer. Electric power input to the power pad (2a) is supplied to the ring wiring 15 through the I/O cell. The electric power supplied to the ring wiring 15 is distributed to the internal circuit group (cell group) of the semiconductor integrated circuit through the mesh wiring 14 with the mesh shape.

The power wiring structure 10 is not limited to the structure shown in FIG. 3. The power wiring structure 10 can have not less than three wiring layers. In such a multi-layer wiring layer structure, resistance of a power wiring in the lower layer (local wiring) is generally larger than resistance of a power wiring in the upper layer (global wiring). In FIG. 3, resistance of the first power wiring 11 formed in the first wiring layer is larger than resistance of the second power wiring 12 formed in the second wiring layer. For example, a width of the second power wiring 12 is designed to be larger than a width of the first power wiring 11. A thickness of the second power wiring 12 may be larger than a thickness of the first power wiring 11.

2. Design Method

Figure 4:
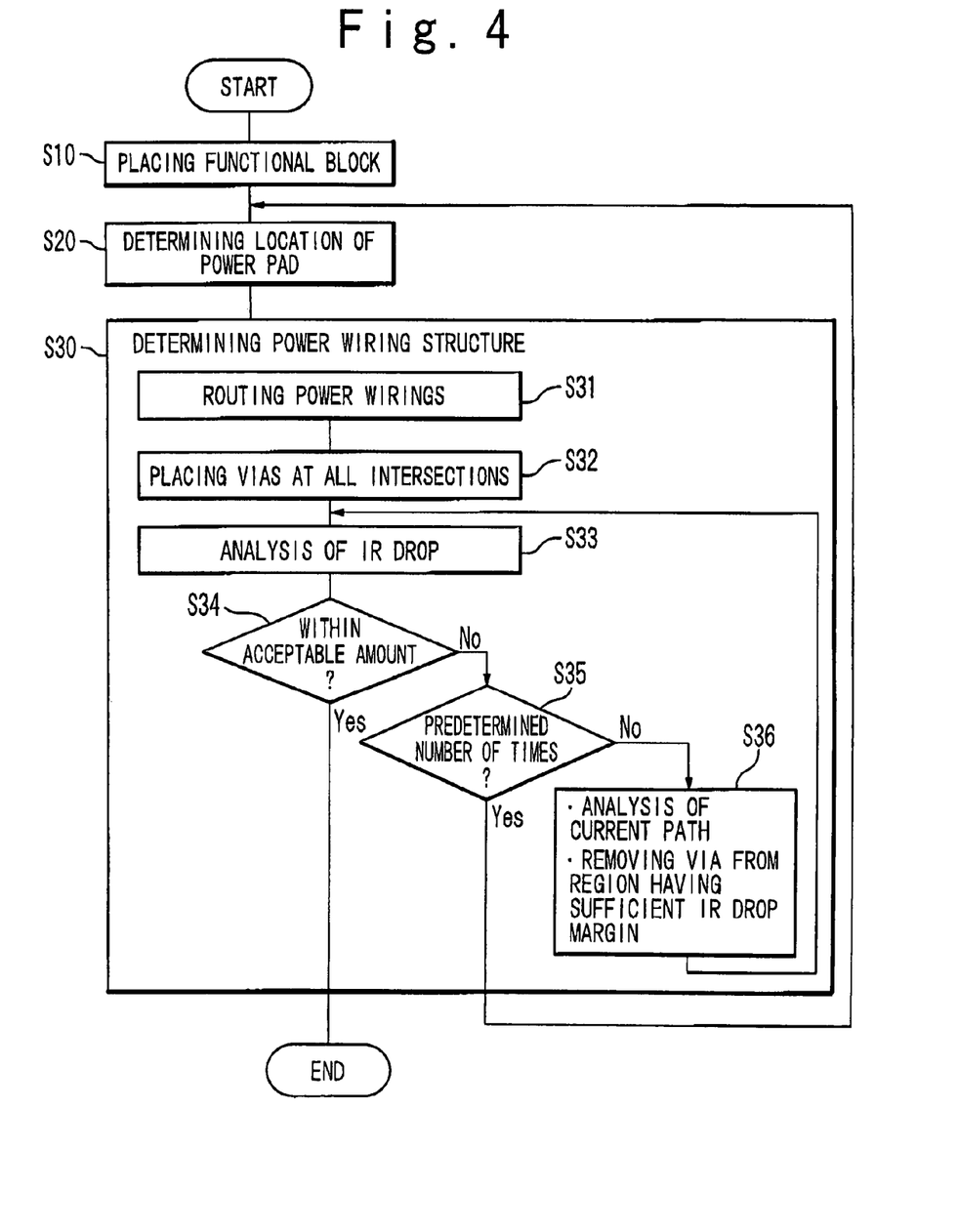
FIG. 4 is a flowchart showing a method of designing according to the embodiment of the present invention.

Next, a method of designing the semiconductor integrated circuit according to the present embodiment will be explained with reference to a flowchart shown in FIG. 4.

First, functional blocks are placed at predetermined positions in a layout region corresponding to the semiconductor chip 1 (Step S10). Next, locations of the power pads (power supply points) are determined (Step S20). For example, the locations of the power pads are set to the periphery of the semiconductor chip 1, as shown in FIG. 2. Here, a placement balance of the power pads is determined in accordance with a distribution of electric power consumption in the chip. Next, the power wiring structure 10 connecting the power pads and the functional blocks is placed (Step S30). The power wiring structure 10 has the structure as shown in FIG. 3. The Step S30 will be described below in more detail with reference to a plan view shown in FIG. 5 and a cross-sectional view shown in FIG. 6.

Figure 5:
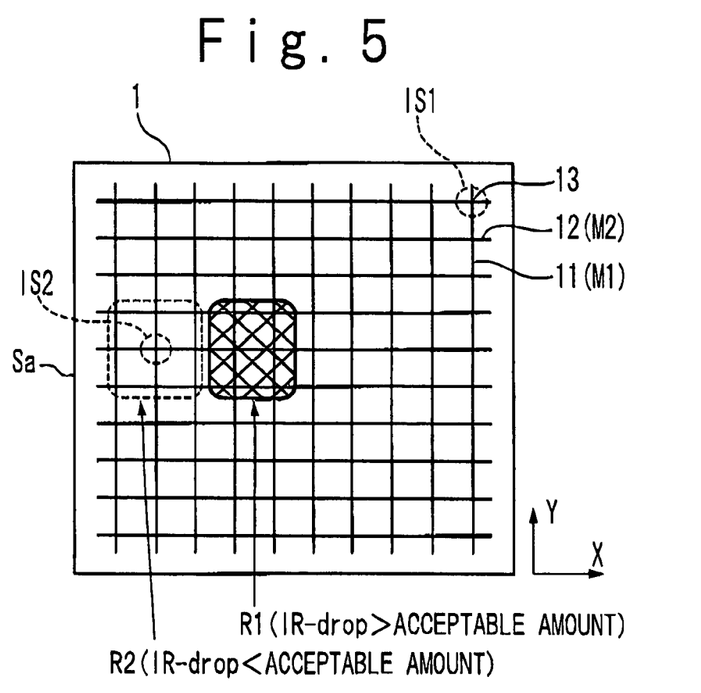
FIG. 5 is a plan view for explaining the method of designing according to the embodiment of the present invention.
Figure 6:
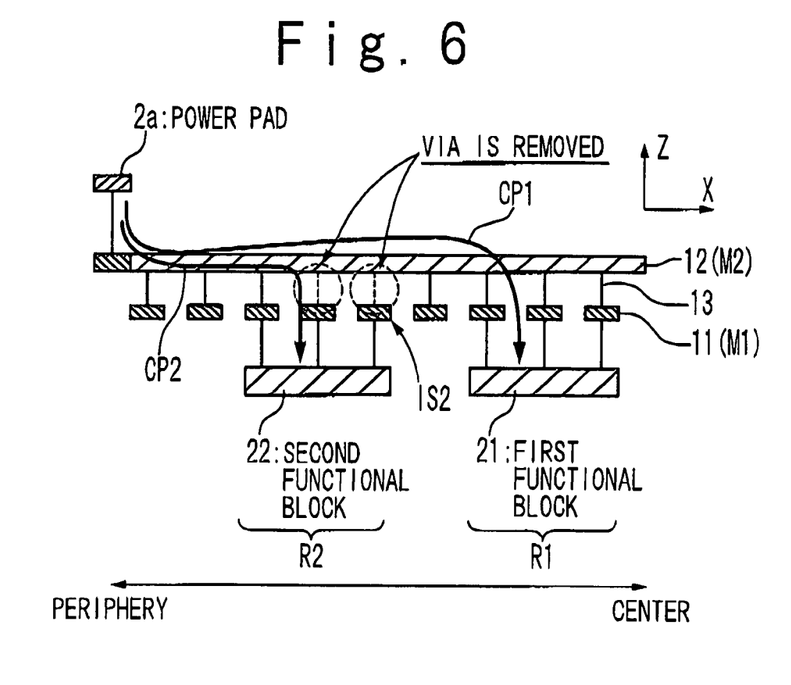
FIG. 6 is a cross-sectional view showing a structure of a semiconductor integrated circuit according to the embodiment of the present invention.

First, the plurality of first power wirings 11 are placed along the Y-direction in the first wiring layer M1. Also, the plurality of second power wirings 12 are placed along the X-direction in the second wiring layer M2 which is an upper layer of the first wiring layer M1 (Step 531). As a result, the plurality of first power wirings 11 and the plurality of second power wirings 12 overlap with each other at the plurality of intersections IS. As will be explained below, the plurality of intersections IS are classified into a first intersection IS1 at which the via 13 is provided and a second intersection IS2 at which the via 13 is not provided.

Next, the vias 13 connecting between the plurality of first power wirings 11 and the plurality of second power wirings 12 are placed. At this time, the vias 13 are placed at all of the intersections IS (IS1, IS2) mentioned above (Step S32). In this manner, a preliminary power wiring structure 10 is temporarily formed.

Next, the voltage drop (IR drop) with regard to the preliminary power wiring structure 10 is analyzed (Step S33). That is, the voltage drop is analyzed with respect to each of the placed functional blocks. Through this analysis, a region (functional block) in which the amount of the voltage drop exceeds a predetermined acceptable amount is searched for.

For example, let us consider a case where a first functional block 21 is placed on a first region R1 and a second functional block 22 is placed on a second region R2 in the semiconductor chip 1, as shown in FIGS. 5 and 6. The second region R2 is located between the power pad 2a (periphery of the chip) and the first region R1. That is to say, the second region R2 is closer to the power pad 2a than the first region R1, and thus the voltage drop in the second region R2 is smaller than the voltage drop in the first region R1.

As a result of the analysis of the voltage drop, the voltage drop in the second region R2 satisfies an acceptable amount of the voltage drop with respect to the second functional block 22. On the other hand, the voltage drop in the first region R1 exceeds an acceptable amount of the voltage drop with respect to the first functional block 21 (Step S34; No). In this case, a current path to the first functional block 21 is analyzed.

As shown in FIG. 5, a side Sa out of four sides of the semiconductor chip 1 is closest to the first region R1. Thus, electric power is supplied to the first functional block 21 mainly from the power pad 2a on the side Sa through a first current path CP1 (see FIG. 6). According to the present embodiment, a part of the placed vias 13 is removed at least from a region that is on the first current path CP1 and has a sufficient voltage drop margin (Step S36). For example, the above-described second region R2 is located between the power pad 2a and the first region R1, and the first current path CP1 to the first functional block 21 passes through the second region R2. Moreover, the amount of the voltage drop in the second region R2 satisfies the acceptable amount. Therefore, the placed via 13 is removed from a part of the intersections within the second region R2. In this case, the second intersection IS2 at which the via 13 is not provided appears in the second region R2, and a second current path CP2 to the second functional block 22 is partially cut off.

Figure 7:
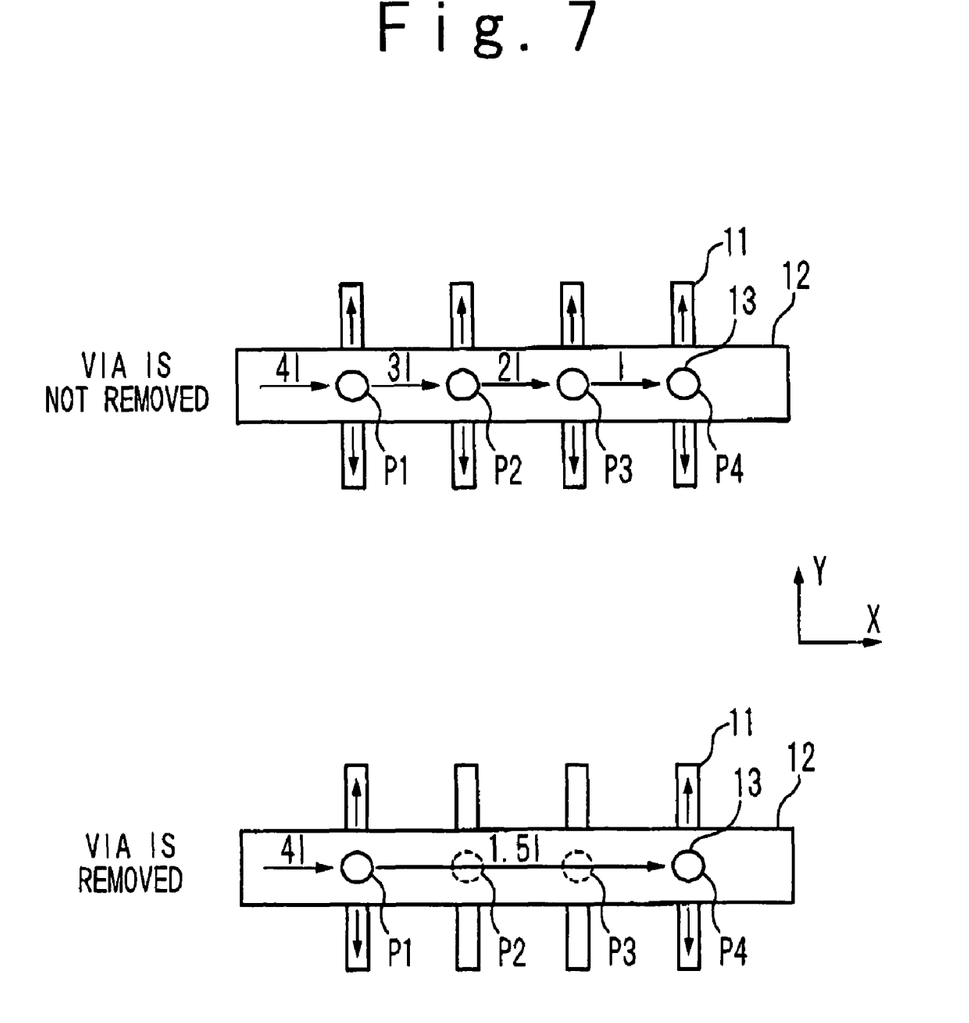
FIG. 7 is a schematic diagram for explaining an effect of the present invention.

An effect obtained by removing the via 13 will be explained with reference to FIG. 7. FIG. 7 schematically shows the first power wirings 11 and the second power wiring 12 in a certain section. The second power wiring 12 intersect with the first power wirings 11, and intersections P1 to P4 appear. It should be noted that the wirings shown in FIG. 7 are part of the mesh wiring 14, the first power wirings 11 shown in FIG. 7 is also connected the second power wiring 12 not shown, and the second power wiring 12 shown in FIG. 7 is also connected to the first power wiring 11 not shown. Only the shortest current path from the power supply point is considered here.

It is assumed that the electric power consumption is uniform over the entire region in FIG. 7. It is also assumed that intervals between the adjacent intersections are equal, and resistance of the second power wiring 12 of each interval (power supply point to P1, P1 to P2, P2 to P3, and P3 to P4) is "R". It is also assumed that if no via 13 is removed, the same current "I" flows into each via 13 provided at the intersections P1 to P4.

In a case where the via 13 is not removed, the current gradually decreases from the intersection P1 towards the intersection P4, as shown in FIG. 7. The amount of the voltage drop at the intersection P4 is given by "(4I+3I+2I+I)*R=10*IR".

On the other hand, in a case where a part of the vias 13 is removed, for example, in a case where the vias 13 are removed from the intersections P2 and P3, the current concentrates on the intersections P1 and P4. For example, a current 2.5I flows into the via 13 at the intersection P1 and a current 1.5I flows into the via 13 at the intersection P4. In this case, the amount of the voltage drop at the intersection P4 is given by "(4I+1.5I+1.5I+1.5I)*R=8.5*IR". That is, the amount of the voltage drop is decreased as compared with the above-mentioned case where no via 13 is removed.

In this manner, it is possible by partially removing the via 13 at a point to alleviate the amount of the voltage drop downstream the point. In other words, it is possible to increase the potential at a distant point from the power supply source. As described above, the resistance of the second power wiring 12 in the upper layer is smaller than that of the first power wiring 11 in the lower layer. When the via 13 on the first current path CP1 is removed, the second power wiring 12 with the lower resistance becomes the main wiring path to the first functional block 21. Accordingly, the voltage drop with regard to the first functional block 21 can be reduced. In order to suppress the voltage drop effectively, it is preferable that a part of the vias 13 is removed from the first current path CP1 between the first region R1 and the side Sa closest to the first region R1, as shown in FIGS. 5 and 6.

As described above, the via 13 is partially removed from the second region R2 in the Step S36. After that, the analysis of the voltage drop is executed again (Step S33). If the amount of the voltage drop still exceeds the acceptable amount as a result of the analysis (Step S34; No), the via 13 is further removed from the second region R2 (Step S36). The steps S33 to S36 are thus repeated. The via 13 may be removed one by one in every Step S36. Alternatively, a group of vias 13 may be removed in every Step S36. It should be noted that the removal of the via 13 is performed such that the second current path CP2 to the second functional block 22 does not disappear.

The repetition process may be carried out until the voltage drop satisfies the acceptable amount. Alternatively, if the amount of the voltage drop still exceeds the acceptable amount after the repetition process is carried out for a predetermined number of times (Step S35; Yes), the process can return back to the Step S20. In this case, the location of the power pad (power supply point) is changed. Subsequently, the Step S31 is skipped, and then the vias 13 are placed again at all of the intersections (Step S32). Thereafter, the Steps S33 to S36 are performed repeatedly in a similar manner. If the voltage drop satisfies the acceptable amount over the entire semiconductor chip 1 (Step S34; Yes), the process is finished.

According to the present embodiment, as described above, it is possible by removing the via 13 in order from a region having sufficient voltage drop margin to make the voltage drop in the first region R1 within the allowable level. Therefore, the malfunction of the first functional block 21 can be prevented. Moreover, according to the present embodiment, it is not necessary to provide a special wiring but to just remove a part of the vias 13, in order to reduce the voltage drop. Since it is not necessary to allocate a part of a wiring region to the special wiring, the deterioration of the routing performance is prevented. Furthermore, the present invention can be universally applied to any chips, because the special wiring is not necessary.

3. Application Example 3-1. First Application Example

Figure 8:
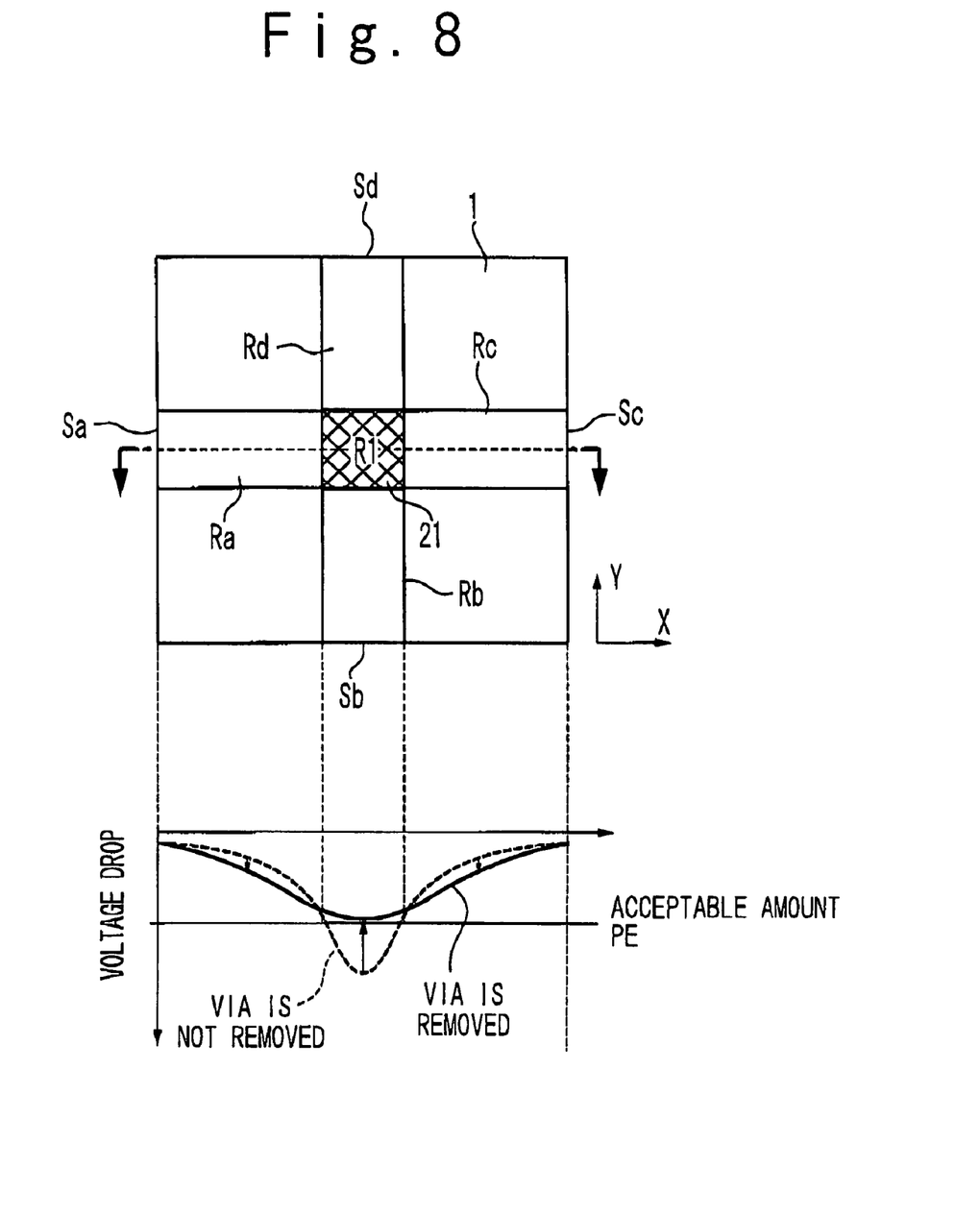
FIG. 8 is a schematic diagram showing an example of a semiconductor chip to which the present invention is applied.

FIG. 8 schematically shows the semiconductor chip 1 in a first application example. In FIG. 8, the first functional block 21 is placed at the center of the semiconductor chip 1. That is, the first region R1 on which the first functional block 21 is placed includes the central part of the semiconductor chip 1. The power pad is placed at the periphery of the semiconductor chip 1, namely, the electric power is supplied from the periphery or the semiconductor chip 1 to the internal circuits. Therefore, the amount of the voltage drop increases towards the center of the semiconductor chip 1. It is assumed that the voltage drop in the first region R1 exceeds the acceptable amount PE unless the present invention is applied.

Therefore, a part of the vias 13 is removed from the second region R2 located between the first region R1 (central part) and the periphery of the semiconductor chip 1. For example, the second region R2 includes four zonal regions Ra to Rd surrounding the first region R1, and the vias 13 are partially removed from respective zonal regions Ra to Rd. The zonal regions Ra and Rc extend from edges of the first region R1 to a side Sa and a side Sc of the semiconductor chip 1 along the X-direction, respectively. On the other hand, the zonal regions Rb and Rd extend from edges of the first region R1 to a side Sb and a side Sd of the semiconductor chip 1 along the Y-direction, respectively. That is to say, the zonal regions Ra to Rd are arranged in a cross-shape manner. A part of the intersections IS included in these zonal regions Ra to Rd becomes the second intersection IS2 at which the via 13 is not provided. The placement of the second intersections IS2 can be appropriately determined in respective zonal regions Ra to Rd. For example, the second intersection IS2 is placed every predetermined number of power wirings in each of the zonal regions Ra to Rd.

Consequently, as shown in FIG. 8, the amount of the voltage drop in the region (the second region R2) having a sufficient voltage drop margin is increased, while the amount of the voltage drop in the first region R1 is decreased. By providing the second intersection IS2 appropriately, the voltage drop satisfies the acceptable amount PE over the entire semiconductor chip 1. As a result, the deterioration of performance of all the internal circuits including the first functional block 21 is prevented.

3-2. Second Application Example

The worst point of the voltage drop is not limited to the central part of the semiconductor chip 1. For example, power density of a high-speed operation functional block is high, and thus the voltage drop in a region where the high-speed operation functional block is placed tends to increase. If the amount of the voltage drop exceeds the acceptable amount, the operation speed of the high-speed operation functional block is decreased. That is to say, the voltage drop in the region where the higher-speed operation is required becomes larger, which causes deterioration of the operation speed.

Figure 9:
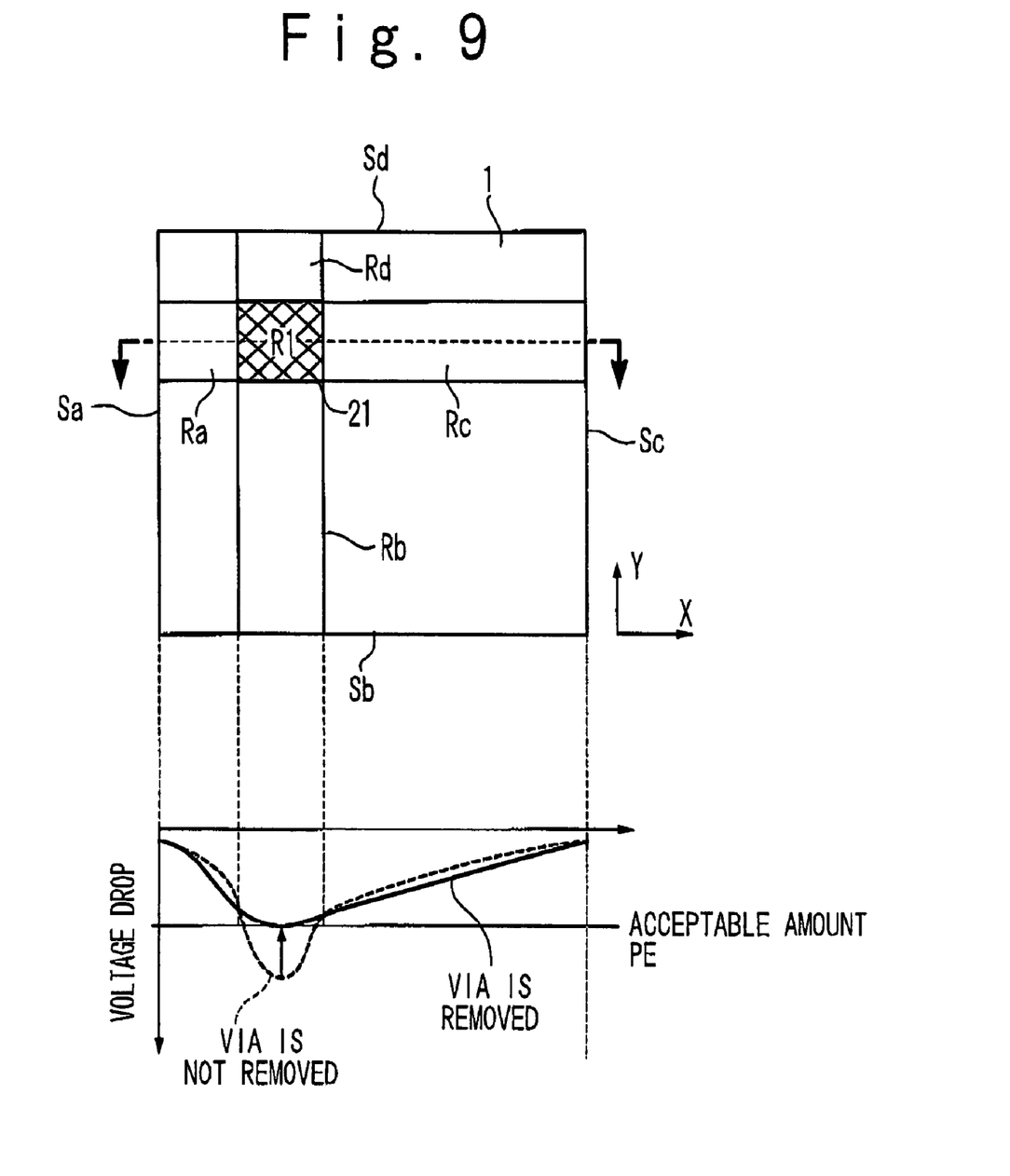
FIG. 9 is a schematic diagram showing another example of a semiconductor chip to which the present invention is applied.

In a second application example, such a high-speed operation functional block is considered. FIG. 9 schematically shows the semiconductor chip 1 in the second application example. In FIG. 9, the first functional block 21 is placed on the first region R1 in the semiconductor chip 1. The first functional block 21 is a high-speed operation functional block. For example, the first functional block 21 is a CPU core. It is assumed that the voltage drop in the first region R1 exceeds the acceptable amount PE unless the present invention is applied.

Therefore, a part of the vias 13 is removed from the second region R2 located between the first region R1 and the power pad 2a. The second functional block 22 is placed on the second region R2 (see FIG. 6). The second functional block 22 has a sufficient voltage drop margin. The power density of the first functional block 21 is higher than the power density of the second functional block 22. That is, electric power consumption per unit area of the first functional block 21 is larger than that of the second functional block 22. In other words, the operation speed of the first functional block 21 is higher than the operation speed of the second functional block 22.

The second region R2 may include the four zonal regions Ra to Rd surrounding the first region R1, as in the first application example. The vias 13 are partially removed from respective zonal regions Ra to Rd, and the second intersection IS2 at which the via 13 is not placed is provided. Consequently, as shown in FIG. 9, the amount of the voltage drop in the region (the second region R2) having a sufficient voltage drop margin is increased, while the amount of the voltage drop in the first region R1 is decreased. By providing the second intersection IS2 appropriately, the voltage drop satisfies the acceptable amount PE over the entire semiconductor chip 1. As a result, the deterioration of performance of all the internal circuits including the first functional block 21 is prevented.

4. Design System (CAD System)

Figure 10:
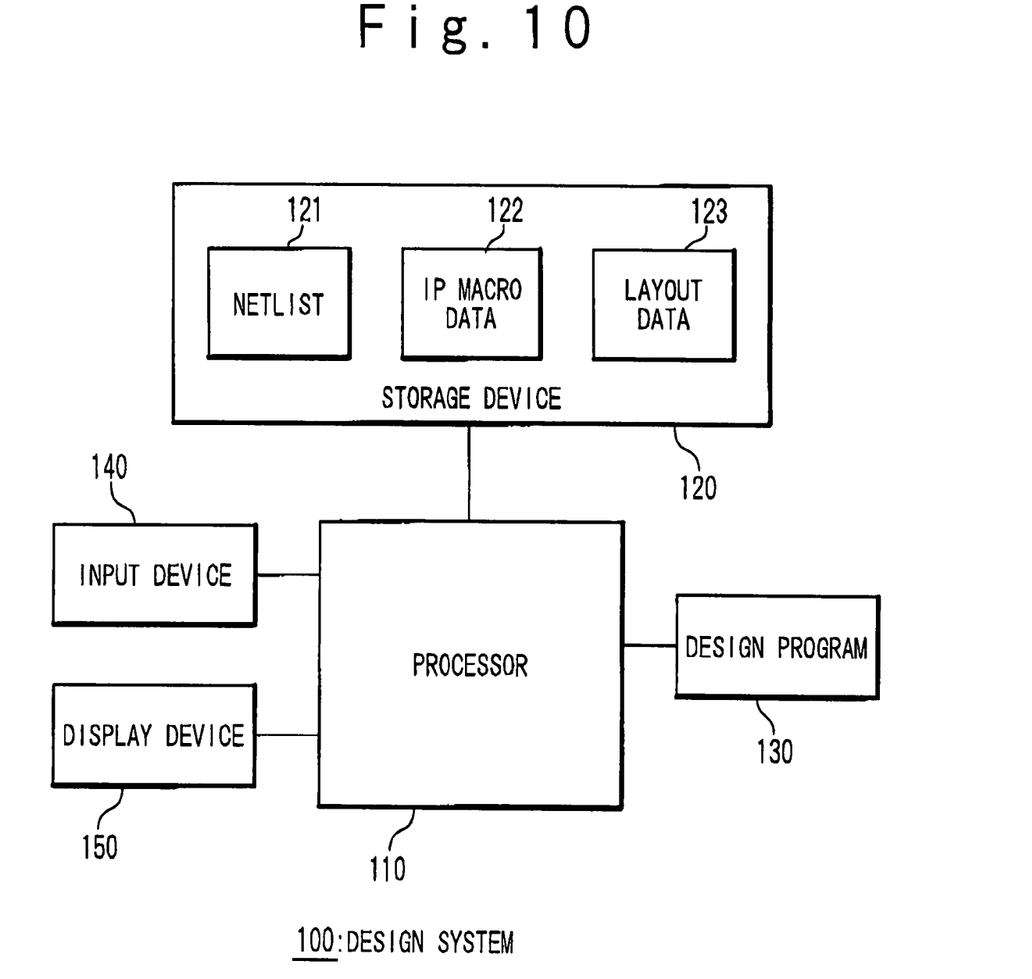
FIG. 10 is a block diagram showing a configuration of a design system according to the embodiment of the present invention.

FIG. 10 is a block diagram showing an example of a design system 100 for executing the design method (layout method) according to the present invention. The design system 100 is realized by a computer such as a workstation and is provided with a processor 110, a storage device 120, an input device 140 and a display device 150.

The storage device 120 is exemplified by a RAM or a hard disk drive. A netlist 121, an IP macro data 122, a layout data 123 and the like are stored in the storage device 120. The netlist 121 describes a connection relationship of a circuit and used in the layout process. The IP macro data 122 provides the above-described functional blocks. The layout data 123 indicates a circuit layout, which is generated by the layout process.

The input device 140 is exemplified by a keyboard or a mouse. A designer can input various data and commands by using the input device 140, referring to information displayed by the display device 150.

The processor 110 executes a design program 130. The design program 130 is recorded in a computer readable recording medium, for example. The design program 130 provides the design function (layout function) according to the present invention in cooperation with the processor 110. In the layout process, the netlist 121 and the IP macro data 122 are used. As a result of the layout process, the layout data 123 including a layout pattern of the above-mentioned power wiring structure 10 is produced. On the basis of the produced layout data 123, the semiconductor integrated circuit according to the present embodiment is manufactured.

It is apparent that the present invention is not limited to the above embodiment and may be modified and changed without departing from the scope and spirit of the invention.

What is claimed is:

1. A semiconductor integrated circuit comprising:
   a power pad disposed on a chip; and
   a circuit group connected to said power pad through a power wiring structure,
   wherein said power wiring structure includes:
      a plurality of first power wirings and a plurality of second power wirings that are disposed in different wiring layers and overlap with each other at a plurality of intersections; and
      vias connecting said plurality of first power wirings and said plurality of second power wirings,
   wherein said circuit group includes a first functional block placed on a first region, and said vias are not placed at a part of said plurality of intersections within a second region located between said first region and said power pad,
   wherein said power pad is disposed at a periphery of said chip,
   wherein said plurality of first power wirings are disposed along a first direction, said plurality of second power wirings are disposed along a second direction orthogonal to said first direction, and said chip has a zonal region extending from an edge of said first region to a side of said chip along said first direction or said second direction, and
   wherein said vias are not placed at a part of said plurality of intersections within said zonal region.

2. A semiconductor integrated circuit comprising:
   a power pad disposed on a chip; and
   a circuit group connected to said power pad through a power wiring structure,
   wherein said power wiring structure includes:
      a plurality of first power wirings and a plurality of second power wirings that are disposed in different wiring layers and overlap with each other at a plurality of intersections; and vias connecting said plurality of first power wirings and said plurality of second power wirings, wherein said circuit group includes a first functional block placed on a first region, and said vias are not placed at a part of said plurality of intersections within a second region located between said first region and said power pad, and wherein said plurality of first power wirings are disposed in a first wiring layer, said plurality of second power wirings are formed in a second wiring layer that is an upper layer of said first wiring layer, and resistance of each of said plurality of second power wirings is smaller than resistance of each of said plurality of first power wirings.

3. A semiconductor integrated circuit comprising:

a power pad disposed on a chip; and a circuit group connected to said power pad through a power wiring structure, wherein said power wiring structure includes:

a plurality of first power wirings and a plurality of second power wirings that are disposed in different wiring layers and overlap with each other at a plurality of intersections; and vias connecting said plurality of first power wirings and said plurality of second power wirings, wherein said circuit group includes a first functional block placed on a first region, and said vias are not placed at a part of said plurality of intersections within a second region located between said first region and said power pad, and wherein a resistance of the first power wirings is larger than a resistance of the second power wirings.

* * * * *